(12) United States Patent
Hata

(10) Patent No.: US 6,303,875 B1
(45) Date of Patent: Oct. 16, 2001

(54) IC PACKAGES REPLACEABLE BY IC PACKAGES HAVING A SMALLER PIN COUNT AND CIRCUIT DEVICE USING THE SAME

(75) Inventor: Shoichi Hata, Tokyo (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/236,441

(22) Filed: Jan. 25, 1999

(30) Foreign Application Priority Data

Jan. 23, 1998 (JP) .................................................. 10-011441

(51) Int. Cl.⁷ ..................................................... H05K 1/16
(52) U.S. Cl. ........................ 174/260; 174/52.1; 174/261; 257/690; 361/772; 361/774
(58) Field of Search ............................. 257/735, 690–700; 174/260, 52.1–52.6, 261; 361/767, 768, 769, 770, 771, 772, 777, 778, 783, 774

(56) References Cited

U.S. PATENT DOCUMENTS

| | | | |
|---|---|---|---|
| 3,805,120 | * 4/1974 | Cranston | 257/735 |
| 5,682,297 | * 10/1997 | Silva | 361/777 |
| 5,777,853 | * 7/1998 | Dorfmeyer | 361/777 |
| 5,959,845 | * 9/1999 | Faucher | 361/777 |

\* cited by examiner

Primary Examiner—Jeffrey Gaffin
Assistant Examiner—Jeremy Norris
(74) Attorney, Agent, or Firm—Oblon, Spivak, McClelland, Maier & Neustadt, P.C.

(57) ABSTRACT

There are provided IC packages which eliminate the need for preparing a plurality of wiring boards even when different types of IC packages are used and a circuit device using the same. A 128-pin package is arranged, so as to output the same signal from two pins positioned on both ends of each edge thereof and wires of a wiring board corresponding to those pins are short-circuited.

10 Claims, 10 Drawing Sheets

FIG.6

| PIN NO. OF 128-PIN PACKAGE | | PIN NO. OF 120-PIN PACKAGE |
|---|---|---|
| 1 | LOGIC CIRCUIT POWER SUPPLY(+3V) | |
| 2 | LOGIC CIRCUIT POWER SUPPLY(+3V) | 1 |
| 3 | CONTROL SIGNAL (OUTPUT) | 2 |
| 4 | CONTROL SIGNAL (OUTPUT) | 3 |
| 5 | CONTROL SIGNAL (OUTPUT) | 4 |
| 6 | COLOR SIGNAL (OUTPUT) | 5 |
| 7 | COLOR SIGNAL (OUTPUT) | 6 |
| 8 | COLOR SIGNAL (OUTPUT) | 7 |
| 9 | COLOR SIGNAL (OUTPUT) | 8 |
| 10 | COLOR SIGNAL (OUTPUT) | 9 |
| 11 | COLOR SIGNAL (OUTPUT) | 10 |
| 12 | COLOR SIGNAL (OUTPUT) | 11 |
| 13 | COLOR SIGNAL (OUTPUT) | 12 |
| 14 | COLOR SIGNAL (OUTPUT) | 13 |
| 15 | COLOR SIGNAL (OUTPUT) | 14 |
| 16 | COLOR SIGNAL (OUTPUT) | 15 |
| 17 | COLOR SIGNAL (OUTPUT) | 16 |
| 18 | COLOR SIGNAL (OUTPUT) | 17 |
| 19 | COLOR SIGNAL (OUTPUT) | 18 |
| 20 | COLOR SIGNAL (OUTPUT) | 19 |
| 21 | COLOR SIGNAL (OUTPUT) | 20 |
| 22 | LOGIC CIRCUIT POWER SUPPLY(+3V) | 21 |
| 23 | LOGIC CIRCUIT GND | 22 |
| 24 | COLOR SIGNAL (OUTPUT) | 23 |
| 25 | COLOR SIGNAL (OUTPUT) | 24 |
| 26 | COLOR SIGNAL (OUTPUT) | 25 |
| 27 | COLOR SIGNAL (OUTPUT) | 26 |
| 28 | LOGIC CIRCUIT POWER SUPPLY(+3V) | 27 |
| 29 | DETECTING TERMINAL (GND) | 28 |
| 30 | DETECTING TERMINAL (GND) | 29 |
| 31 | LOGIC CIRCUIT (GND) | 30 |
| 32 | LOGIC CIRCUIT (GND) | |
| 33 | PLL CIRCUIT POWER SUPPLY | |
| 34 | PLL CIRCUIT POWER SUPPLY | 31 |
| 35 | NON-CONNECTED | 32 |
| 36 | LOW-PASS FILTER (INPUT) | 33 |
| 37 | PLL CIRCUIT GND | 34 |
| 38 | LVDS GND | 35 |
| 39 | LVDS (INPUT) | 36 |
| 40 | LVDS (INPUT) | 37 |
| 41 | LVDS (INPUT) | 38 |
| 42 | LVDS (INPUT) | 39 |

FIG.7

| PIN NO. OF 128-PIN PACKAGE | | PIN NO. OF 120-PIN PACKAGE |
|---|---|---|
| 43 | LVDS (INPUT) | 40 |
| 44 | LVDS (INPUT) | 41 |
| 45 | LVDS (INPUT) | 42 |
| 46 | LVDS (INPUT) | 43 |
| 47 | LVDS (INPUT) | 44 |
| 48 | LVDS GND | 45 |
| 49 | LVDS POWER SUPPLY | 46 |
| 50 | COLOR SIGNAL (OUTPUT) (INPUT) | 47 |
| 51 | COLOR SIGNAL (OUTPUT) (INPUT) | 48 |
| 52 | LVDS (INPUT) | 49 |
| 53 | LVDS (INPUT) | 50 |
| 54 | LVDS (INPUT) | 51 |
| 55 | LVDS (INPUT) | 52 |
| 56 | LVDS (INPUT) | 53 |
| 57 | LVDS (INPUT) | 54 |
| 58 | LVDS (INPUT) | 55 |
| 59 | LVDS (INPUT) | 56 |
| 60 | LVDS (INPUT) | 57 |
| 61 | DETECTING TERMINAL (GND) | 58 |
| 62 | LVDS GND | 59 |
| 63 | LVDS POWER SUPPLY | 60 |
| 64 | LVDS POWER SUPPLY | |
| 65 | DETECTING TERMINAL (GND) | |
| 66 | DETECTING TERMINAL (GND) | 61 |
| 67 | DETECTING TERMINAL (GND) | 62 |
| 68 | LOGIC CIRCUIT POWER SUPPLY(+3V) | 63 |
| 69 | LOGIC CIRCUIT GND | 64 |
| 70 | PLL CIRCUIT POWER SUPPLY | 65 |
| 71 | LOW-PASS FILTER (INPUT) | 66 |
| 72 | NON-CONNECTED | 67 |
| 73 | PLL CIRCUIT GND | 68 |
| 74 | LOGIC CIRCUIT POWER SUPPLY(+3V) | 69 |
| 75 | LOGIC CIRCUIT GND | 70 |
| 76 | CONTROL SIGNAL (INPUT) | 71 |
| 77 | CONTROL SIGNAL (INPUT) | 72 |
| 78 | CONTROL SIGNAL (INPUT) | 73 |
| 79 | CONTROL SIGNAL (INPUT) | 74 |
| 80 | CONTROL SIGNAL (INPUT) | 75 |
| 81 | CONTROL SIGNAL (INPUT) | 76 |
| 82 | CONTROL SIGNAL (INPUT) | 77 |
| 83 | CONTROL SIGNAL (INPUT) | 78 |
| 84 | CONTROL SIGNAL (INPUT) | 79 |

FIG.8

| PIN NO. OF 128-PIN PACKAGE | | PIN NO. OF 120-PIN PACKAGE |
|---|---|---|
| 85 | DETECTING TERMINAL (GND) | 80 |
| 86 | CONTROL SIGNAL (INPUT) | 81 |
| 87 | RESET TERMINAL | 82 |
| 88 | LOGIC CIRCUIT GND | 83 |
| 89 | LOGIC CIRCUIT POWER SUPPLY(+3V) | 84 |
| 90 | CONTROL SIGNAL (OUTPUT) | 85 |
| 91 | CONTROL SIGNAL (OUTPUT) | 86 |
| 92 | CONTROL SIGNAL (OUTPUT) | 87 |
| 93 | CONTROL SIGNAL (OUTPUT) | 88 |
| 94 | CONTROL SIGNAL (INPUT) | 89 |
| 95 | CONTROL SIGNAL (INPUT) | 90 |
| 96 | CONTROL SIGNAL (INPUT) | |
| 97 | CONTROL SIGNAL (OUTPUT) | |
| 98 | CONTROL SIGNAL (OUTPUT) | 91 |
| 99 | CONTROL SIGNAL (OUTPUT) | 92 |
| 100 | CONTROL SIGNAL (OUTPUT) | 93 |
| 101 | CONTROL SIGNAL (OUTPUT) | 94 |
| 102 | COLOR SIGNAL (OUTPUT) (INPUT) | 95 |
| 103 | COLOR SIGNAL (OUTPUT) (INPUT) | 96 |
| 104 | COLOR SIGNAL (OUTPUT) (INPUT) | 97 |
| 105 | COLOR SIGNAL (OUTPUT) (INPUT) | 98 |
| 106 | LOGIC CIRCUIT GND | 99 |
| 107 | LOGIC CIRCUIT POWER SUPPLY(+3V) | 100 |
| 108 | COLOR SIGNAL (INPUT) | 101 |
| 109 | COLOR SIGNAL (INPUT) | 102 |
| 110 | COLOR SIGNAL (INPUT) | 103 |
| 111 | COLOR SIGNAL (INPUT) | 104 |
| 112 | COLOR SIGNAL (INPUT) | 105 |
| 113 | COLOR SIGNAL (INPUT) | 106 |
| 114 | COLOR SIGNAL (INPUT) | 107 |
| 115 | COLOR SIGNAL (INPUT) | 108 |
| 116 | LOGIC CIRCUIT POWER SUPPLY(+3V) | 109 |
| 117 | LOGIC CIRCUIT GND | 110 |
| 118 | COLOR SIGNAL (INPUT) | 111 |
| 119 | COLOR SIGNAL (INPUT) | 112 |
| 120 | COLOR SIGNAL (INPUT) | 113 |
| 121 | COLOR SIGNAL (INPUT) | 114 |
| 122 | COLOR SIGNAL (INPUT) | 115 |
| 123 | COLOR SIGNAL (INPUT) | 116 |
| 124 | CONTROL SIGNAL (OUTPUT) | 117 |
| 125 | CONTROL SIGNAL (OUTPUT) | 118 |
| 126 | CONTROL SIGNAL (OUTPUT) | 119 |
| 127 | LOGIC CIRCUIT GND | 120 |
| 128 | LOGIC CIRCUIT GND | |

IC PACKAGES REPLACEABLE BY IC PACKAGES HAVING A SMALLER PIN COUNT AND CIRCUIT DEVICE USING THE SAME

BACKGROUND OF THE INVENTION

1. Field of the Invention

The present invention relates to IC packages and a circuit device using the same and more particularly to those used in a liquid crystal display.

2. Description of the Related Art

Several IC packages are used in a liquid crystal display. For instance, an IC package having 120 pins or an IC package having 128 pins for a liquid crystal controller ASIC is mounted on a wiring board. In such a case, it is necessary to prepare a wiring board having wires corresponding to the respective number of pins as the wiring board on which such IC package is mounted.

However, there is a case of adopting both IC packages of 120 pins and 128 pins recently in order to accommodate to multiple vendors. In such a case, two kinds of wiring boards corresponding to the respective ones must be prepared, bringing about problems that it increases the cost and is disadvantageous also in terms of production management.

Accordingly, In view of such problems, it is an object of the present invention to provide IC packages which make it unnecessary to prepare a plurality of wiring boards even when different types of IC packages are used and to provide a circuit device using such IC packages.

SUMMARY OF THE INVENTION

An inventive IC package whose plane shape is rectangular and having (n+2) pins projecting from each edge is arranged such that its plane shape is the same and intervals and positions of the pins projecting from each edge are the same with another IC package whose plane shape is rectangular and having n pins projecting from each edge; and that the IC package outputs the same signal from the first and second pins of each edge and outputs the same signal from the (n+1)-th pin and the (n+2)-th pin of each edge.

A circuit device comprising an IC package in which (n+2) pins project from each edge and a wiring board on which the IC package is mounted is arranged such that the IC package has the same plane shape and the same intervals and positions of the pins projecting from each edge with another IC package whose plane shape is rectangular and which contains n pins projecting from each edge; that the IC package outputs the same signal from first and second pins of each edge and outputs the same signal from the (n+1)-th and (n+2)-th pins of each edge, respectively; and that first and second wires electrically connected respectively with the first and second pins of each edge of the IC package are short-circuited and the (n+1)-th and (n+2)-th wires electrically connected respectively with the (n+1)-th and (n+2)-th pins of each edge of the IC package are short-circuited in the wiring board.

According to the invention described above, the circuit device may be realized just by preparing one wiring board in adopting the IC package in which (n+2) pins project from each edge thereof (hereinafter referred to as a large size package) and the other IC package in which n pins project from each edge thereof (hereinafter referred to as a small size package).

That is, when the large size package is mounted on the wiring board, it operates in the same manner as the small size package because the same signal is outputted from the first and second pins and the first and second wires are short-circuited even though the outputted same signals are sent to the first and second wires, respectively.

The specific nature of the invention, as well as other objects, uses and advantages thereof, will clearly appear from the following description and from the accompanying drawings in which like numerals refer to like parts.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 is a first table showing the relationship between pin Nos. and signals of the packages;

FIG. 7 is a second table showing the relationship between pin Nos. and signals of the packages;

FIG. 8 is a third table showing the relationship between pin Nos. and signals of the packages;

DESCRIPTION OF THE PREFERRED EMBODIMENTS

One embodiment of the present invention will be explained based on FIGS. 1 through 10.

Figure 1:
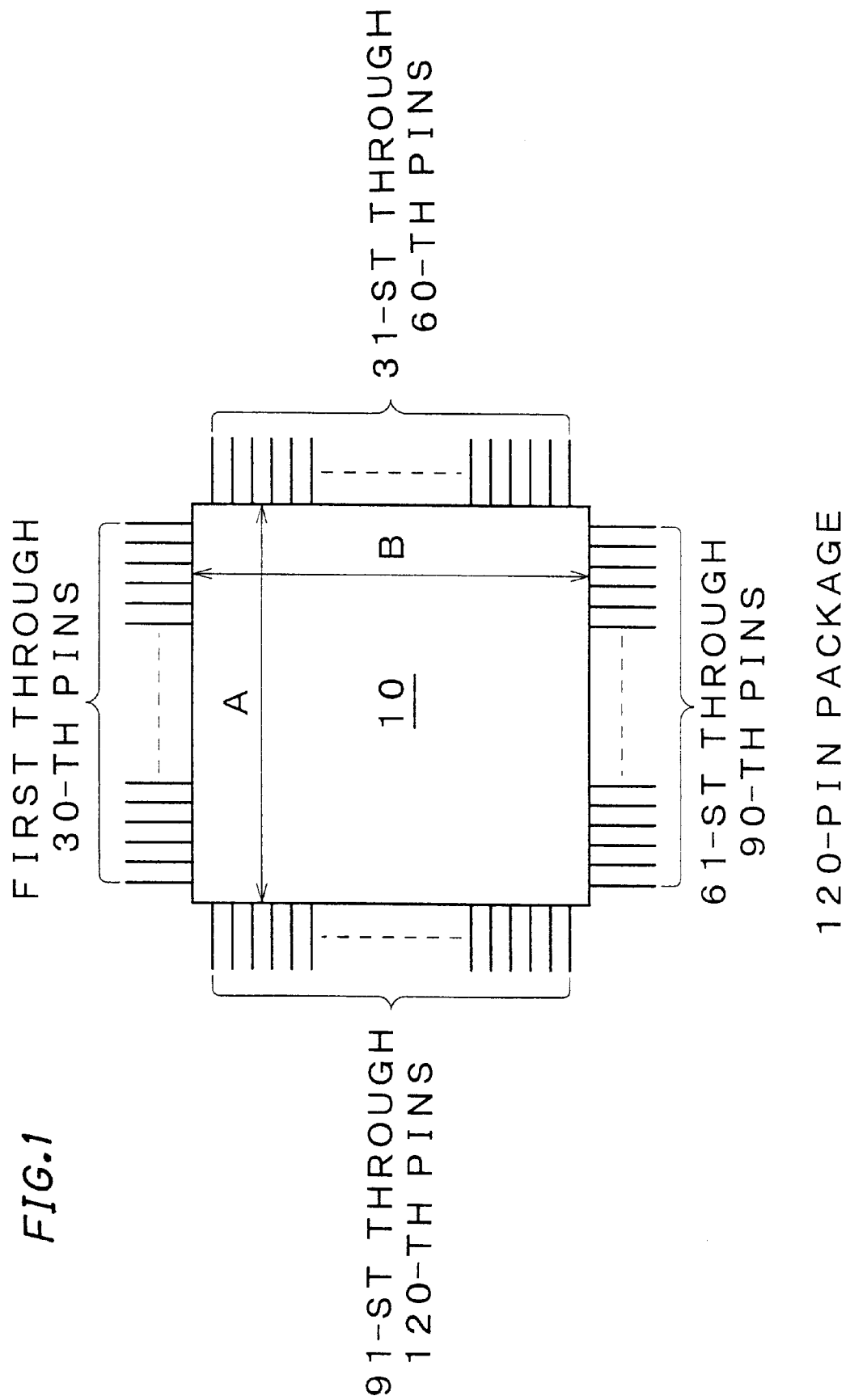
FIG. 1 is a plan view of a 120-pin package.
Figure 2:
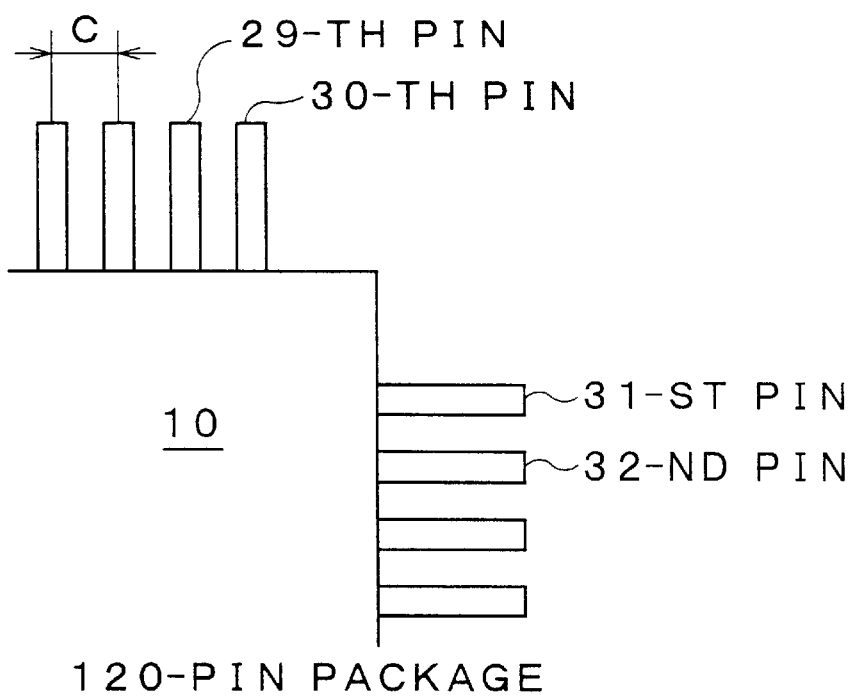
FIG. 2 is an enlarged plan view of the main part of the package shown in FIG. 1.
Figure 3:
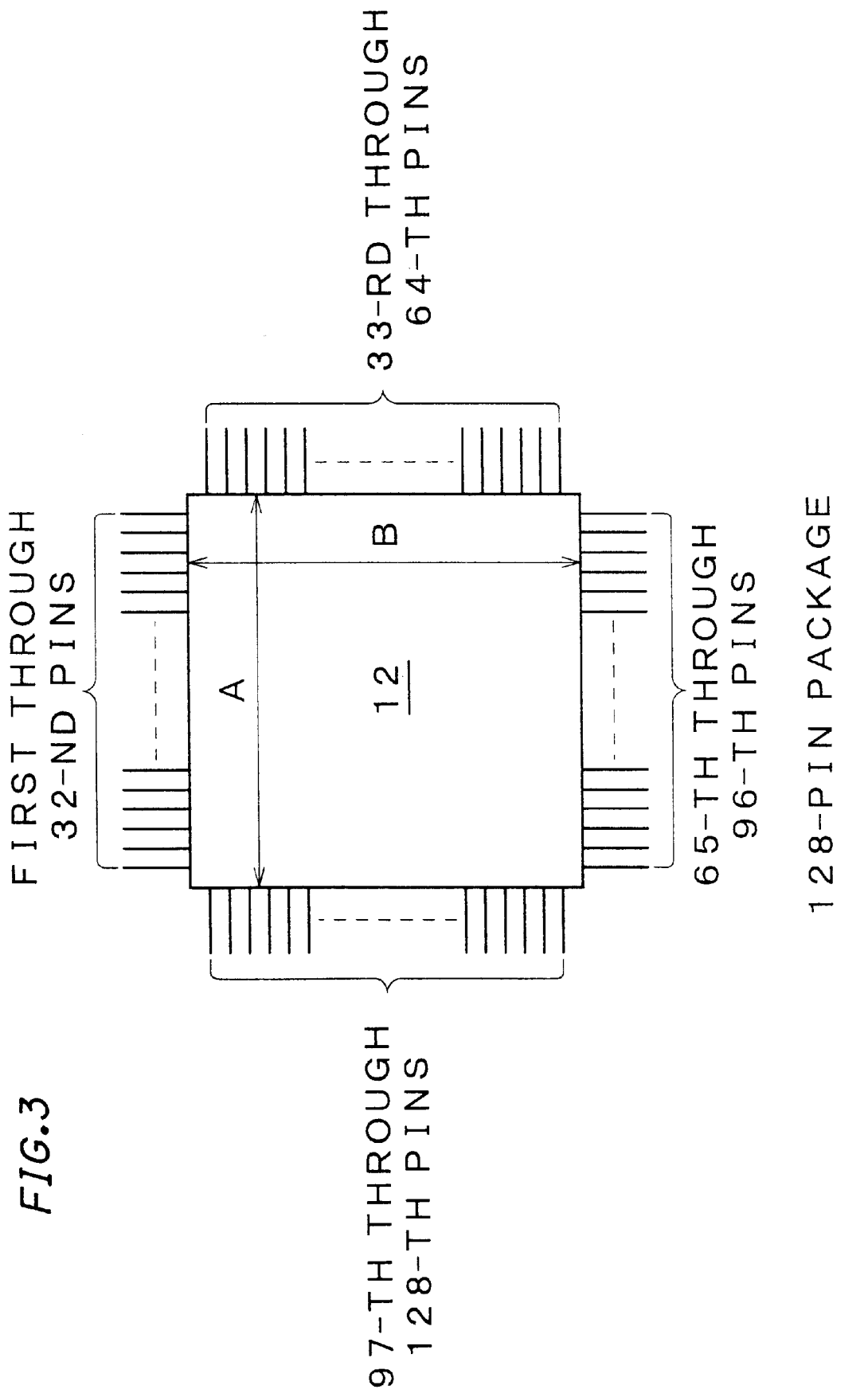
FIG. 3 is a plan view of a 128-pin package.
Figure 4:
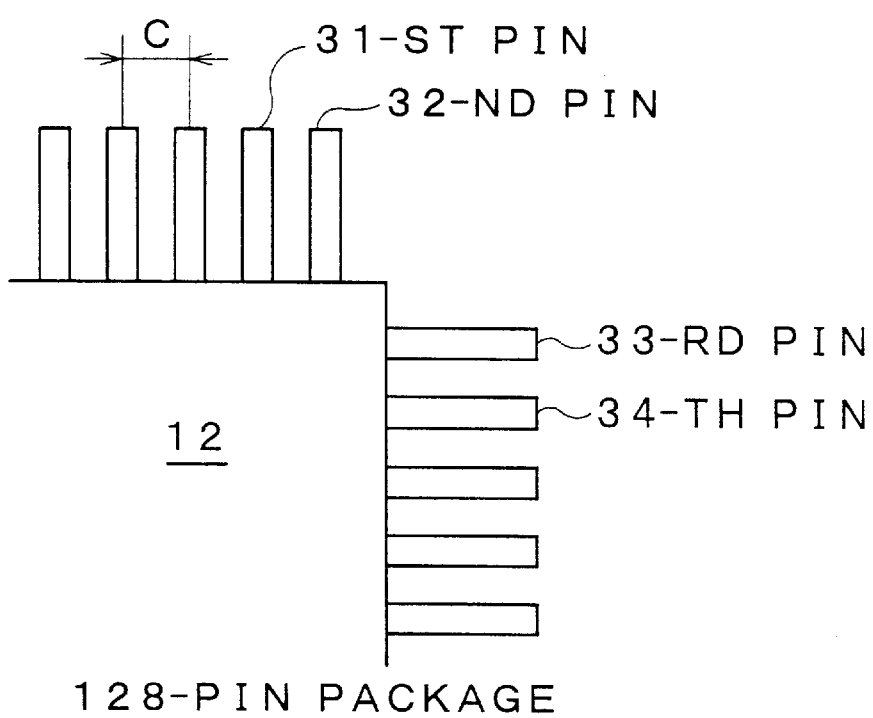
FIG. 4 is an enlarged plan view of the main part of the package shown in FIG. 3.

In the present embodiment, there are a small type package 10 shown in FIGS. 1 and 2 and a large type package 12 shown in FIGS. 3 and 4 and these will be explained hereinafter.

At first, a 120-pin package 10 which is one of the small type package will be explained based on FIGS. 1 and 2. The 120-pin package 10 has a rectangular plane shape whose horizontal and vertical dimensions A and B are 14 mm, respectively. 30 pins project from each edge (120 pins in total) and the projecting interval (pitch) C between the pins is 0.4 mm.

Next, a 128-pin package 12 which is one of the large type package will be explained based on FIGS. 3 and 4. Similarly to the 120-pin package 10, the 128-pin package 12 has a rectangular plane shape whose horizontal and vertical dimensions A and B are 14 mm, respectively. 32 pins project from each edge (128 pins in total) and the projecting interval (pitch) C between the pins is 0.4 mm similarly also to the 120-pin package 10 as shown in FIG. 4.

That is, while the outer dimension of the 128-pin package 12 is the same as that of the 120-pin package 10, its number of pins at each edge is different by two.

Figure 5:
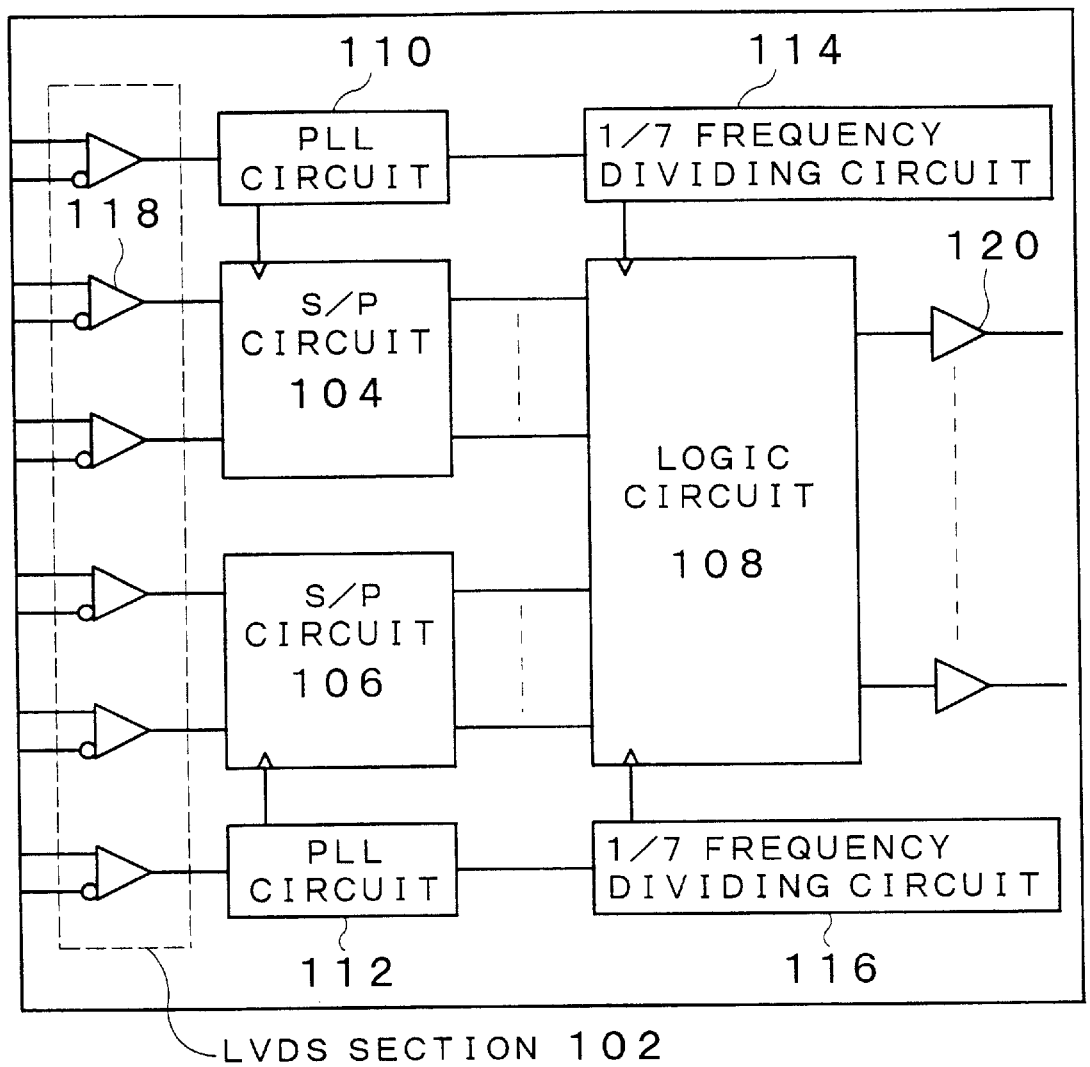
FIG. 5 is a block diagram within the packages.

FIG. 5 is a block diagram of the inside of the 120-pin package 10 and the 128-pin package 12. The 120-pin package 10 and the 128-pin package 12 have a common structure.

As shown in FIG. 5, the diagram comprises PLL circuits 110 and 112 and 1/7 frequency dividing circuits 114 and 116 in addition to the structure of a low voltage differential circuit section (hereinafter referred to as a LVDS section) 102, serial-parallel converting circuits (hereinafter referred to as S/P circuits) 104 and 106 and a logic circuit 108. It is noted that the LVDS section 102 comprises a plurality of comparators 118 and the logic circuit 108 comprises gate arrays. A plurality of amplifiers 120 are disposed on the output side of the logic circuit 108.

Serial data transmitted via the LVDS 102 with a low voltage and at high frequency (227.5 MHz) to deal with EMS is converted into a parallel signal by the S/P circuit 104. In this case, it is converted into the parallel signal based on a clock signal of 227.5 MHz sent via the PLL circuits 110 and 112. Then, each data converted into the parallel signal is inputted to the logic circuit 108 and is converted into a control signal necessary for driving a liquid crystal display. In this case, the clock signal of 227.5 MHz sent via the PLL circuits 110 and 112 is divided into 32.5 MHz by the 1/7 frequency dividing circuits 114 and 116 and the logic circuit 108 is driven based on that clock signal.

FIGS. 6 through 8 show types of signals inputted to/outputted from each pin of the 120-pin package 10 and the 128-pin package 12. It is noted that FIGS. 6, 7 and 8 show one arrangement as a whole.

The signals inputted to/outputted from each pin of the 120-pin package 10 and the 128-pin package 12 will be explained below based on FIGS. 6 through 8.

First through 30-th pins of the upper edge of the 120-pin package 10 and second through 31-st pins of the upper edge of the 128-pin package 12 correspond to each other and handle the same signals, respectively. 31-st through 60-th pins of the right edge of the 120-pin package 10 and 34-th through 63-rd pins of the right edge of the 128-pin package 12 correspond to each other and handle the same signals, respectively. 61-st through 90-th pins of the lower edge of the 120-pin package 10 and 66-th through 95-th pins of the lower edge of the 128-pin package 12 correspond to each other and handle the same signals, respectively. 91-st through 120-th pins of the left edge of the 120-pin package 10 and 98-th through 127-th pins of the upper left of the 128-pin package 12 correspond to each other and handle the same signals, respectively.

The first pin of the 128-pin package 12 handles the same signal (logic circuit power supply) as that of the second pin.

The 31-st pin of the 128-pin package 12 handles the same signal (logic circuit GND) as that of the 32-nd pin.

The 33-rd pin of the 128-pin package 12 handles the same signal (PLL circuit power supply) as that of the 34-th pin.

The 63-rd pin of the 128-pin package 12 handles the same signal (LVDS power supply) as that of the 64-th pin.

The 65-th pin of the 128-pin package 12 handles the same signal (detecting terminal or GND) as that of the 66-th pin.

The 95-th pin of the 128-pin package 12 handles the same signal (input control signal) as that of the 96-th pin.

The 97-th pin of the 128-pin package 12 handles the same signal (output control signal) as that of the 98-th pin.

The 127-th pin of the 128-pin package 12 handles the same signal (logic circuit GND) as that of the package 128-th pin.

Next, a wiring board 14 on which those two kinds of IC packages 10 and 12 can be used will be explained based on FIGS. 9 and 10.

128 wires are provided on the wiring board 14 at the positions corresponding to the 128 pins of the 128-pin package 12. Among them, the first wire is short-circuited with the second wire, the 31-st wire is short-circuited with the 32-nd wire and the 33-rd wire is short-circuited with the 34-th wire as shown in FIG. 9. Two wires on the both sides of each edge are short-circuited in the same manner, respectively.

Figure 10:
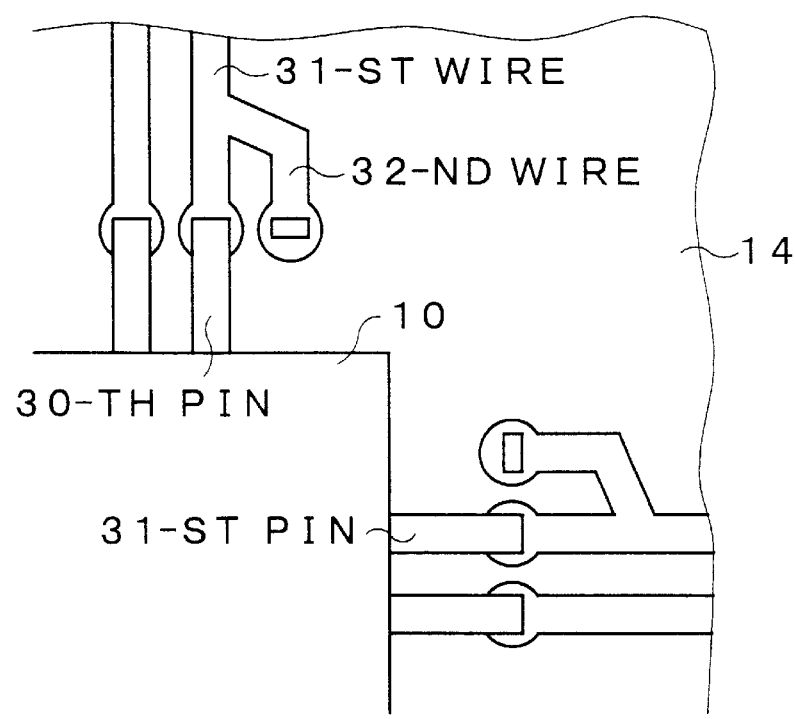
FIG. 10 is a plan view of the state in which the 120-pin package is mounted on the wiring board.

When the 120-pin package 10 is mounted on the above-mentioned wiring board 14, the 30-th pin of the 120-pin package 10 is electrically connected with the 31-st wire and no pin is connected with the 32-nd wire as shown in FIG. 10.

When the 120-pin package 10 is used in this state, the signal (logic circuit GND) is outputted from the 30-th pin to the 31-st wire, thus activating the liquid crystal display for example.

Figure 9:
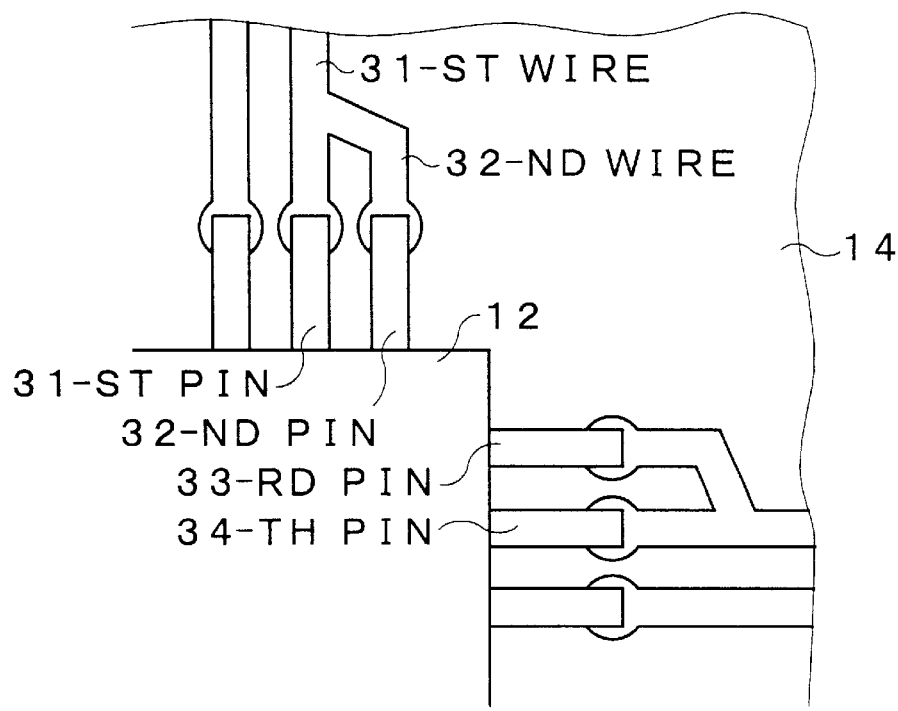
FIG. 9 is a plan view of the state in which the 128-pin package is mounted on a wiring board.

Next, when the 128-pin package 12 is mounted on the wiring board 14, the 31-st wire is electrically connected with the 31-st pin and the 32-nd wire is electrically connected with the 32-nd pin as shown in FIG. 9. However, because the same signal (logic circuit GND) is outputted from the 31-st and 32-nd pins and the 31-st wire is short-circuited with the 32-nd wire, the 128-pin package 12 operates in the same manner with the 120-pin package 10 by outputting that signal.

Thus, the 128-pin package 12 can share the ASIC with the 120-pin package 10 which has eight less pins by outputting the same signal from the two pins on one side as described above.

Therefore, a maker can mount the 128-pin package 12 on the wiring board when the maker has the 128-pin package 12 and no 120-pin packages 10, and vice versa, by having the wiring board 14 to accommodate the multiple vendors, thus reducing the cost and facilitating the production management.

Although the above-mentioned embodiment has been explained by using the 120-pin package 10 as the small type package and the 128-pin package 12 as the large type package, the number of pins is not limited to those described above and the present invention may be practiced by using packages having another number of pins.

Figure 11:
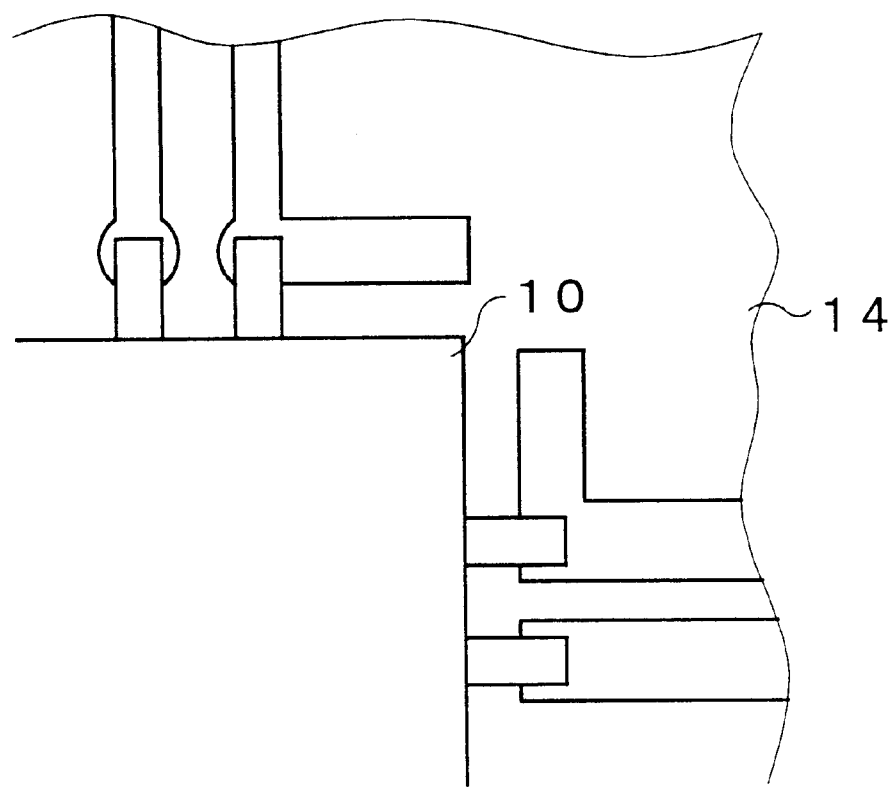
FIG. 11 is a plan view of the state in which the 120-pin package is mounted on another wiring board.

Further, instead of the wiring board 14 described above, it is possible to arrange the wiring board such that the 31st and the 32-nd wires are wired as a common wire and only a land connected to the pins is formed so as to have a wide width corresponding to the 31-st and 32-nd pins of the 128-pin package as shown in FIG. 11 for example.

Although the pins at the ends of each edge of the package are liable to be deformed, i.e., liable to expand to the outside for example, the present embodiment can assure the electrical and mechanical connection in mounting the 120-pin package because the land corresponding to the pins at the ends is formed to have a fully wide width as shown in FIG. 11.

As described above, the invention allows the two types of IC packages to be mounted on one wiring board, so that the maker can reduce the cost and can manage the production readily even if the maker provides accommodation for multiple vendors.

While the preferred embodiments have been described, variations thereto will occur to those skilled in the art within the scope of the present inventive concepts which are delineated by the following claims.

What is claimed is:

1. An IC package having a rectangular plane shape and a plurality of pins projecting from each edge of said package, wherein at least pins adjacent to each other at one end of one edge carry the same signal generated by a signal-generating circuit inside or outside of the IC package when the IC package is fed with power and input signals, thereby said IC package being replaceable with another IC package having a smaller number of pins on each edge of its rectangular body than said IC package.

2. An IC package, comprising:

a body having a rectangular plane shape; and (n+2) pins projecting from each edge of said body spaced from each other by an interval;

when the IC package being fed with power and input signals,
- a first signal being output from a first signal-generating circuit in the IC package through each of first and second pins of each said edge; and
- a second signal being output from a second signal-generating circuit in the IC package through each of (n+1)-th and (n+2)-th pins of each said edge,
- thereby said IC package being replaceable with another IC package having n pins on each edge of its rectangular body.

3. A package as recited in claim 2, wherein:

positions of said pins on each edge and said intervals of said pins are substantially the same as those of a second IC package having a second body with substantially said rectangular plane shape and having n pins on each edge of said second body.

4. A package as recited in claim 2, comprising:

a second through (n+1)-th pins of said package handling the same signals as said n pins of said second package, respectively.

5. A circuit device, comprising:

a body having a plurality of conductive areas for connecting with pins of an IC package, said package having a substantially rectangular shape with (n+2) pins projecting from at least one edge with a predetermined pitch; and a land positioned corresponding to and electrically connected to at least a pair of said pins of said IC package at an end portion of said at least one edge of said IC package, said pair of pins carrying a signal generated by a signal-generating circuit inside or outside of the IC package when the IC package is fed with power and input signals, thereby another IC package provided with n pins on each edge of its rectangular body being mountable in place said IC package.

6. The circuit device according to claim 5, wherein a second IC package having a substantially rectangular plane shape and containing n pins projecting from at least one edge with said predetermined pitch can be connected to said device.

7. A package as recited in claim 6, comprising:

a second through (n+1)-th pins of said IC package handling the same signals as said n pins of said second IC package, respectively.

8. A circuit device, comprising:

an IC package having a plane shape and (n+2) pins projecting from each edge;

said pins being located on each edge at predetermined positions with a predetermined pitch;

a wiring board, having wires, on which said IC package is mounted;

first and second wires electrically connected to first and second pins of each edge of said IC package, respectively, said first and second wires being short-circuited on said board;

(n+1)-th and (n+2)-th wires electrically connected to (n+1)-th and (n+2)-th pins of each edge of said IC package, respectively, said (n+1)-th and (n+2)-th wires being short-circuited on said board; and signal-generating circuits, in the IC package, which generate output signals when the IC package being fed with power and input signals;

said IC package outputting a same first output signal from said first and second pins of each edge and outputting a same second output signal from said (n+1)-th and (n+2)-th pins of each edge of said IC package, respectively, thereby another IC package provided with n pins on each edge of its rectangular body being mountable in place said IC package.

9. The circuit device according to claim 8, wherein a second IC package having a plane shape and containing n pins projecting from each one edge with said predetermined pitch can be connected to said wiring board.

10. A device as recited in claim 9, comprising:

said second through (n+1)-th pins of said IC package handling the same signals as said n pins of said second IC package, respectively.

* * * * *